United States Patent
Lanfranco et al.

(10) Patent No.: US 9,853,601 B2
(45) Date of Patent: Dec. 26, 2017

(54) METHOD, APPARATUS AND SYSTEM FOR ENVELOPE TRACKING

(71) Applicant: NOKIA SOLUTIONS AND NETWORKS OY, Espoo (FI)

(72) Inventors: Sandro Lanfranco, San Jose, CA (US); Xiaokun Yang, Beijing (CN); Zhancang Wang, Beijing (CN)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 0 days.

(21) Appl. No.: 14/908,021

(22) PCT Filed: Jul. 26, 2013

(86) PCT No.: PCT/CN2013/080205
§ 371 (c)(1),
(2) Date: Jan. 27, 2016

(87) PCT Pub. No.: WO2015/010328
PCT Pub. Date: Jan. 29, 2015

(65) Prior Publication Data
US 2016/0164470 A1   Jun. 9, 2016

(51) Int. Cl.
| | | |
|---|---|---|
| H03F 1/02 | (2006.01) | |
| H03F 1/32 | (2006.01) | |
| H03F 3/193 | (2006.01) | |
| H03F 3/24 | (2006.01) | |
| H03F 3/19 | (2006.01) | |
| H03F 3/21 | (2006.01) | |

(52) U.S. Cl.
CPC ......... H03F 1/0233 (2013.01); H03F 1/0266 (2013.01); H03F 1/0272 (2013.01);
(Continued)

(58) Field of Classification Search
CPC ................ H03F 3/04; H03F 1/0233
(Continued)

(56) References Cited

U.S. PATENT DOCUMENTS 4,291,661 A * 9/1981 Gerry ............... F02P 3/005
                                                123/606
6,008,698 A * 12/1999 Dacus ............... H03F 1/0211
                                                330/279
(Continued)

OTHER PUBLICATIONS

International Search Report and Written Opinion dated May 6, 2014, issued in corresponding International Application No. PCT/CN2013/080205.

*Primary Examiner* — Patricia T Nguyen
(74) *Attorney, Agent, or Firm* — Squire Patton Boggs (US) LLP

(57) ABSTRACT

This disclosure relates generally to the field of wireless communication infrastructure, and more particularly to a method, apparatus and system for envelope tracking. The system for envelope tracking comprising: a transistor; an RF transistor; a driver; a switcher current source; and a subtracting network; wherein the system is configured such that when an envelope voltage is less than a predetermined voltage value, the RF transistor is configured for decreasing an amount of absorbed biasing current, and when the envelope voltage is greater than a predetermined voltage value, the RF transistor is configured for increasing an amount of absorbed biasing current. The goal of RF transistor sinking is to absorb the redundant biasing current generated by the envelope tracking supply modulator to eliminate distortions.

19 Claims, 5 Drawing Sheets

(52) U.S. Cl.
CPC ............. *H03F 1/3205* (2013.01); *H03F 3/19* (2013.01); *H03F 3/1935* (2013.01); *H03F 3/21* (2013.01); *H03F 3/245* (2013.01); *H03F 2200/102* (2013.01); *H03F 2200/15* (2013.01); *H03F 2200/451* (2013.01)

(58) Field of Classification Search
USPC .......................................... 330/297, 10, 296
See application file for complete search history.

(56) References Cited

U.S. PATENT DOCUMENTS

| | | | | |
|---|---|---|---|---|
| 6,157,253 | A * | 12/2000 | Sigmon | H03F 1/0222 330/10 |
| 7,723,969 | B1 * | 5/2010 | Li | G05F 1/565 323/273 |
| 8,494,468 | B1 * | 7/2013 | Muhammad | H04B 1/04 330/136 |
| 8,897,724 | B2 * | 11/2014 | Hou | H03F 1/025 455/127.1 |
| 2004/0080364 | A1 * | 4/2004 | Sander | H03F 1/0227 330/10 |
| 2006/0178119 | A1 * | 8/2006 | Jarvinen | H03C 5/00 455/114.2 |
| 2012/0062323 | A1 * | 3/2012 | Le Gallou | H03F 1/0227 330/297 |
| 2012/0269240 | A1 * | 10/2012 | Balteanu | H03F 1/0227 375/219 |
| 2012/0326783 | A1 * | 12/2012 | Mathe | H03F 1/0227 330/251 |
| 2014/0184334 | A1 * | 7/2014 | Nobbe | H03F 1/0227 330/291 |
| 2016/0072485 | A1 * | 3/2016 | Vice | H03F 1/0255 330/296 |

* cited by examiner

US 9,853,601 B2

METHOD, APPARATUS AND SYSTEM FOR ENVELOPE TRACKING

FIELD OF TECHNOLOGY

This disclosure relates generally to the field of wireless communication infrastructure, and more particularly to a method, apparatus and system for envelope tracking.

BACKGROUND

In the wireless communication infrastructure industry, one technique that is utilized to enhance radio power amplifier (PA) efficiency is envelope tracking (ET). Envelope Tracking is a known approach to RF power amplifier design in which the power supply voltage applied to the PA is constantly adjusted to ensure that the PA is operating at peak efficiency over output power range.

Generally speaking, envelope tracking is high-efficiency architecture for power amplifiers. However, it is typically not used in commercial base transceiver station (BTS) power amplifiers because the necessary envelope modulator is difficult to implement.

SUMMARY

In one embodiment of the present disclosure, an apparatus for envelope tracking is provided and includes a power transistor, an RF transistor, a driver, a switcher current source, and a subtracting network.

In another embodiment of the present disclosure, a system for envelope tracking is provided and includes a transistor, an RF transistor, a driver, a switcher current source, and a subtracting network, wherein the system is configured such that when an envelope voltage is less than a predetermined voltage value, the RF transistor is configured to aid envelope tracking power supply for decreasing an amount of absorbed biasing current, and when the envelope voltage is greater than a predetermined voltage value, the RF transistor is configured to aid envelope tracking power supply for increasing an amount of absorbed biasing current. The goal of RF transistor sinking is to absorb the redundant biasing current generated by the envelope tracking supply modulator to eliminate distortions.

In another embodiment of the present disclosure, a method for envelope tracking is provided and includes the steps of providing an envelope modulator apparatus, the apparatus including a transistor, an RF transistor, a driver, a switcher current source and a subtracting network; modulating, at the subtracting network, a gate of the RF transistor based on an envelope voltage; and sinking, at the RF transistor, redundant biasing current generated by the envelope modulator apparatus.

DESCRIPTION OF THE SEVERAL VIEWS OF THE DRAWINGS

To aid in the proper understanding of the present disclosure, reference should be made to the accompanying drawings, wherein.

DETAILED DESCRIPTION

Figure 1:
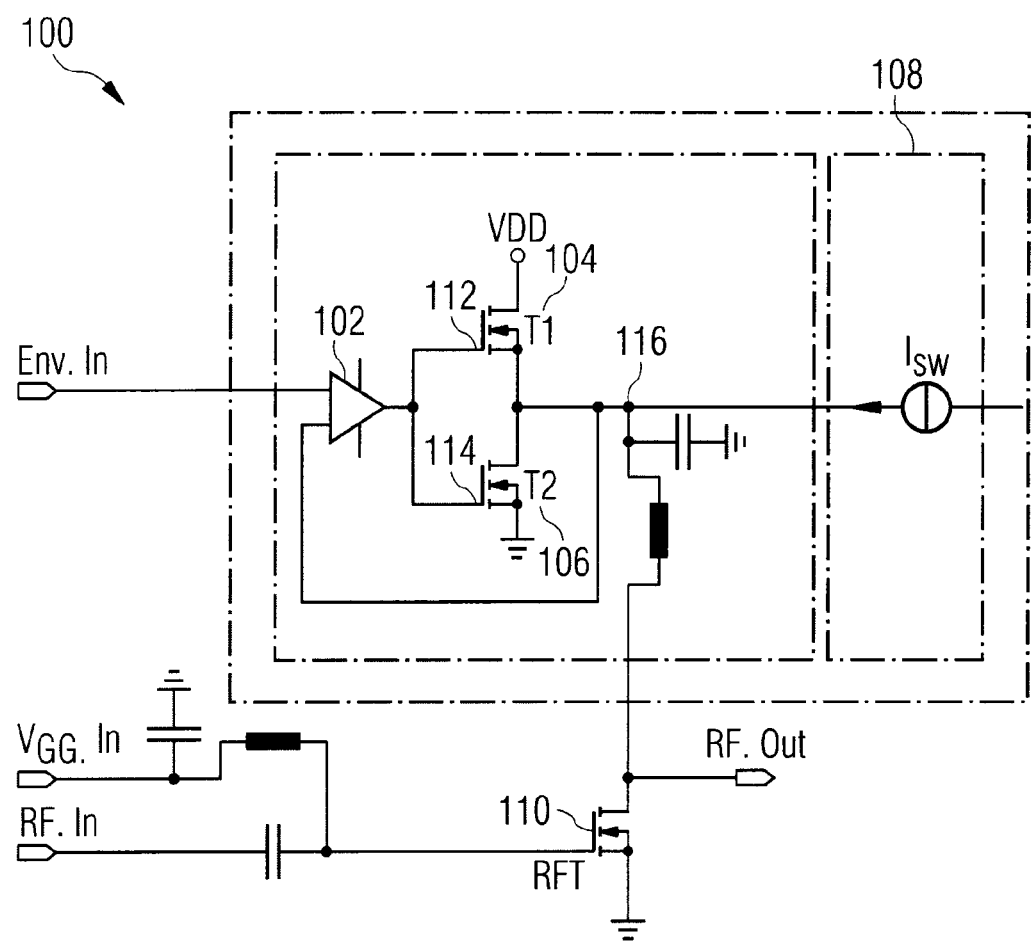
FIG. 1 is a circuit diagram showing an example prior art envelope modulator architecture.

Referring first to FIG. 1, a conventional envelope tracking system 100 is illustrated. The system 100 includes a driver 102, a first power transistor (T1) 104, a second power transistor (T2) 106, a switcher current source 108, and a RF transistor 110. In the system 100, the driver 102, first power transistor 104 and second power transistor 106 form a linear envelope amplifier, which provides the proper envelope voltage to the RF transistor 110 as power supply. The current to the system is primarily provided by the switcher current source 108, which can be a BUCK DC-DC converter or lsw, although similar converters may be utilized, as recognized by those having ordinary skill of the art. However, the BUCK switcher does detail an exemplary application of the present invention. The reader should not construe any context specific examples given herein as limiting the present invention. The first power transistor 104 and the second power transistor 106 are configured for correcting the current to the system when needed by sourcing current and sinking current, respectively; more specifically, the first power transistor 104 can add or source current when needed, and the second power transistor can absorb or sink current when needed.

In the system 100, envelope voltage is received at the driver 102 and then sent on to a first transistor gate 112 and a second transistor gate 114, respectively. The switcher current source 108 provides current to the system, as mentioned briefly above. When current through the RF transistor 110 is low (based on an earlier predetermination made in another part of the system and not discussed in detail herein), the envelope voltage at a T1-T2-$I_{sw}$ junction 116 is also low. To address this low voltage/low current situation, the driver 102 acts to change the voltage at the first transistor gate 112 and the second transistor gate 114, which in turn forces T1 104 to provide more current to the RF transistor 110 and T2 106 to sink or absorb less current. The net result is an increase to the current traveling through the RF transistor 110, which renders a higher and more efficient envelope voltage received at the RF transistor.

As clearly seen in the prior art system 100 of FIG. 1, three total transistors are utilized: T1 104, T2 106 and the RF transistor 110. While this system does in the end provide the proper envelope voltage to the RF transistor as power supply, the high number of system components can lead to reduced efficiency, a decreased bandwidth and a larger circuitry profile.

Figure 2:
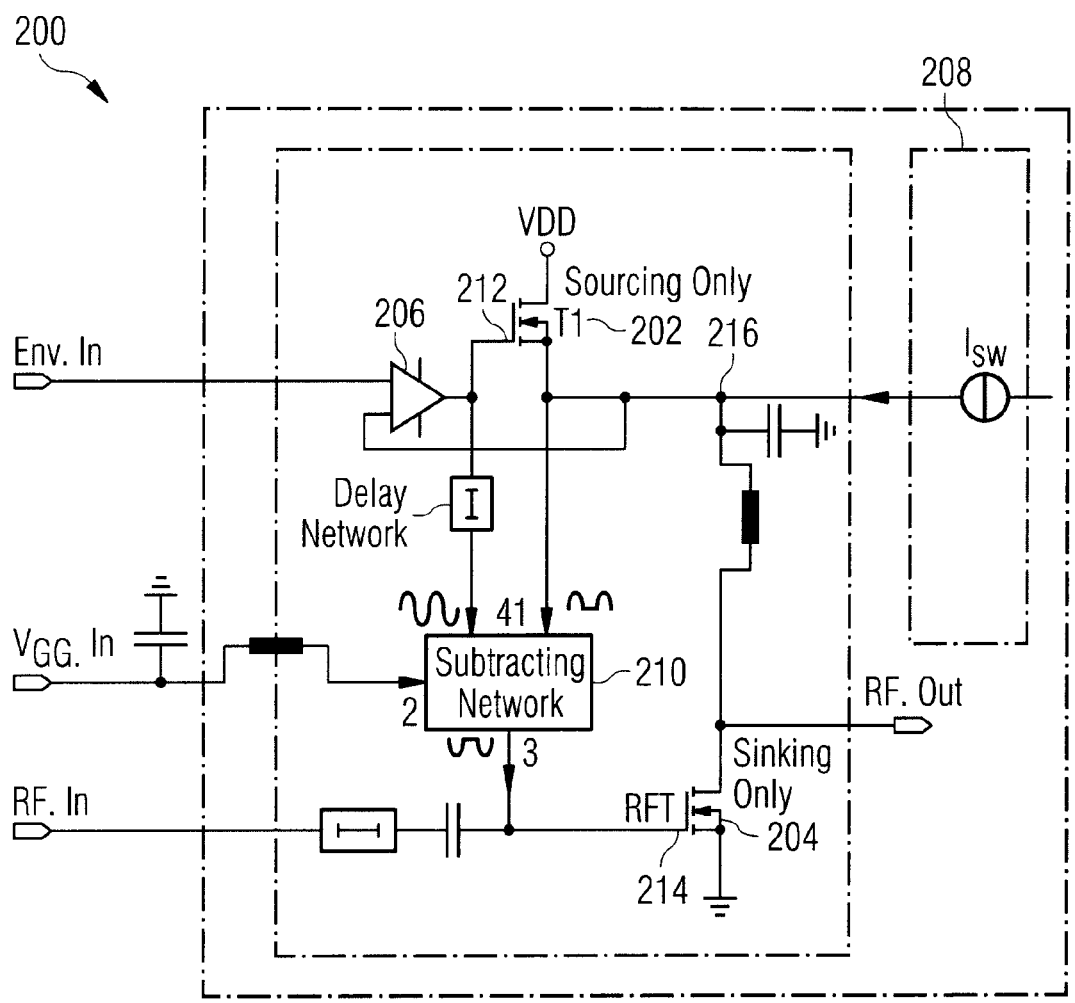
FIG. 2 is a circuit diagram of envelope modulator architecture in accordance with an embodiment of the present disclosure.

Referring next to FIG. 2, an envelope tracking apparatus, system and method for envelope tracking in accordance with the present disclosure is provided. Turning first to FIG. 2, an envelope tracking apparatus 200 is provided and includes a transistor (T1) 202, a RF transistor 204, a driver 206, a switcher current source 208, and a subtracting network 210. The current to the apparatus 200 is primarily provided by the switcher current source 208, which can be a BUCK DC-DC converter switcher current source or lsw, although similar converters may be utilized, as recognized by those having ordinary skill of the art. However, the BUCK switcher does detail an exemplary application of the present invention. The reader should not construe any context specific examples given herein as limiting the present invention. The transistor 202 and the RF transistor 204 are configured for correcting the current to the apparatus 200 when needed; more specifically, the transistor 202 can add current when needed, and the RF transistor 204 can sink or absorb biasing current when needed. Both biasing current and current from a DC-to-RF energy conversion flow through the RF transistor 204. In accordance with the present disclosure, the biasing or quiescent current of the RF transistor 204 is being acted upon (i.e., "sunk" or "absorbed"), which in turn effects the total current flowing through the RF transistor.

The driver 206 is configured for receiving envelope voltage and comparing the envelope voltage to a predetermined voltage value that is predetermined elsewhere in the system and therefore not described in detail herein. As will be described in further detail below, based on whether the envelope voltage is greater than or less than the predetermined voltage value, the driver 206 can act to adjust voltage in the apparatus 200 to ensure that an appropriate envelope voltage is provided to the RF transistor 204.

The subtracting network 210 in the present disclosure can be a combination of a passive transformer 300 (further described with respect to FIG. 3) and an active operational amplifier 400 (also further described with respect to FIG. 3), although it is appreciated that other similar apparatuses may be possible. As seen in FIG. 2, the subtracting network 210 has three inputs, identified as "1", "2" and "4", and one output, identified as "3". Although three inputs and one output are disclosed herein, it is recognized that fewer or more inputs/outputs may be utilized, and the present disclosure is not limited to the three inputs and one output disclosed in this application.

As seen in FIG. 2, the apparatus 200 further includes a transistor gate 212 and an RF transistor gate 214. When the envelope voltage at a T1-$I_{sw}$ junction 216 is above the predetermined value, the driver 206 is configured to decrease the current through the transistor 202 (by acting on the transistor gate 212) and to increase the biasing current of the RF transistor 204 (by acting on the RF transistor gate 214). When the envelope voltage is below the predetermined value, the driver 206 is configured to increase the current through the transistor 202 (by acting on the transistor gate 212) and to decrease the biasing current of the RF transistor 204 (by acting on the RF transistor gate 214). Although the present apparatus 200 is described in the context of a base station application, it is appreciated that the apparatus 200, system and method (both described in further detail below) can be utilized in handsets and other portable wireless devices.

In other words, the apparatus 200 is configured such that when the envelope voltage exceeds the predetermined voltage value, the transistor 202 is configured for providing a decreased amount of current and the RF transistor 204 is configured for increasing the biasing current (i.e., sinking more of the biasing current). In contrast, when the envelope voltage is less than the predetermined voltage value, the transistor 202 is configured for providing an increased amount of current and the RF transistor 204 is configured for decreasing an amount of the biasing current (i.e., sinking less biasing current).

In accordance with the above, therefore, a system for envelope tracking is provided and includes the transistor 202, the RF transistor 204, the driver 206, the switcher current source 208, and the subtracting network 210. As described above, the system is configured such that when the envelope voltage is less than the predetermined voltage value, the RF transistor 204 is configured for decreasing an amount of absorbed biasing current, and when the envelope voltage is greater than the predetermined voltage value, the RF transistor 204 is configured for increasing an amount of absorbed biasing current.

More specifically, when the voltage at the T1-$I_{sw}$ junction 216 is low, the current through the RF transistor 204 is also low. As a result, the driver 206 acts to change the voltage at the transistor gate 212 and, via the subtracting network, 210, the voltage at the RF transistor gate 214. This forces the transistor 202 to provide more current and the RF transistor 204 to sink or absorb less biasing current, thus increasing the voltage at the T1-$I_{sw}$ junction 216. Similarly, when the voltage at the T1-$I_{sw}$ junction 216 is high (i.e., the voltage exceeds the upper limit voltage value), the current through the RF transistor 204 is also high. Such a result would then force the driver 206 to change the voltage at the transistor gate 212 and, via the subtracting network 210, the voltage at the RF transistor gate 214, thereby forcing the transistor 202 to provide less current and the RF transistor 204 to sink or absorb more biasing current. This leads to an overall decreased amount of voltage at the T1-$I_{sw}$ junction 216.

Figure 3:
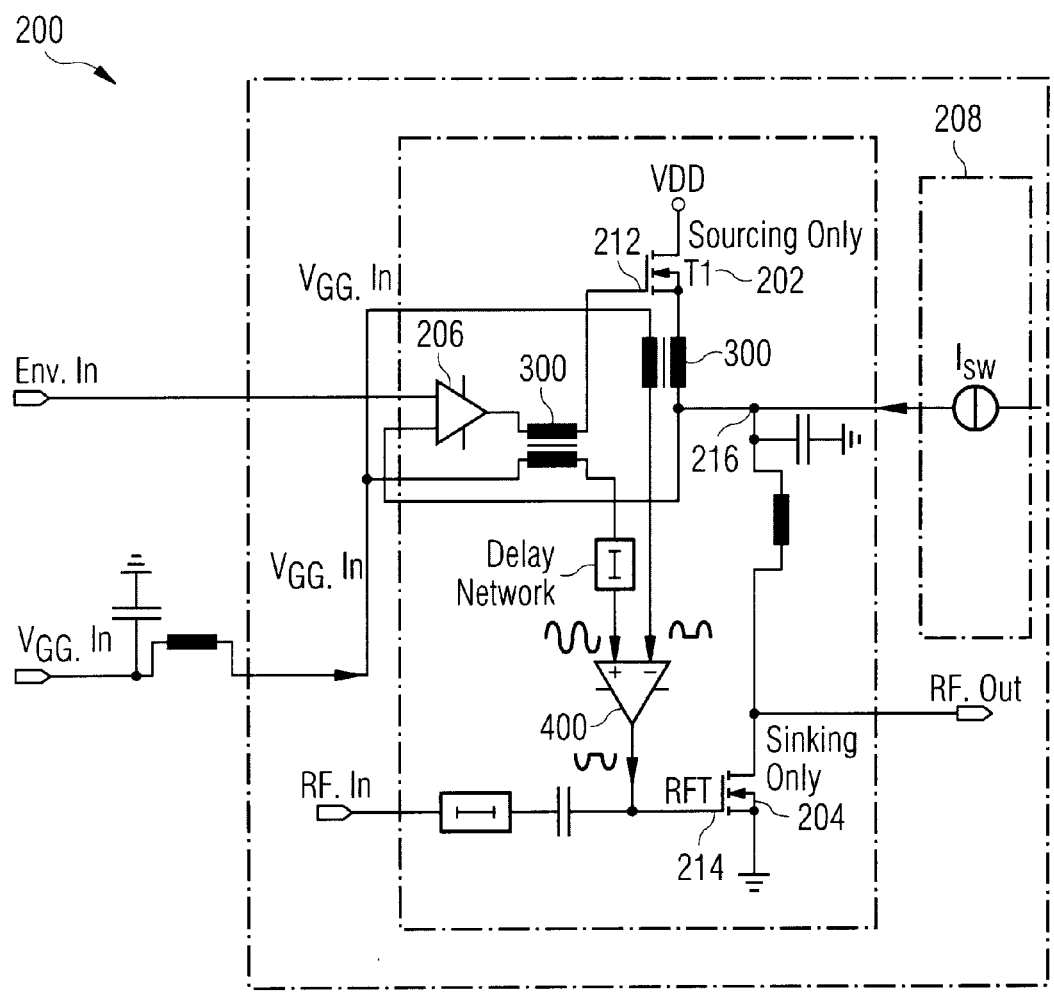
FIG. 3 is a circuit implementation diagram of envelope modulator architecture in accordance with an embodiment of the present disclosure.

Turning now to FIG. 3, in both the apparatus 200 and the system described above, the subtracting network 210 can be the passive transformers 300. The passive transformers 300, as known in the art, are configured for either stepping voltage up or stepping voltage down via induction. Briefly, the transformers 300 work on the principle that energy can be efficiently transferred by magnetic induction from one winding to another winding by a varying magnetic field produced by alternating current (AC). An electrical voltage is induced when there is a relative motion between a wire and a magnetic field. The AC provides the motion required by changing direction which creates a collapsing and expanding magnetic field.

When the passive transformers 300 are utilized in place of the subtracting network 210, the system and apparatus 200 work in much the same manner as described above with respect to FIG. 2. However, when the passive transformers 300 are provided, they act to change the voltage at the RF transistor gate 214 through induction and subtracting node operation, as known in the art. In other words, when the voltage at the T1-$I_{sw}$ junction 216 is low, the driver 206 acts to change the voltage at the transistor gate 212, and via the passive transformers 300, to change the voltage at the RF transistor gate 214. Specifically, when the voltage at the T1-$I_{sw}$ junction 216 is low, the passive transformer 300 is such that a primary winding (not shown) has more turns than a secondary winding (not shown), and the operational amplifier outputs a decreased control voltage, thereby resulting in a decreased voltage output at the RF transistor gate 214. Accordingly, the current provided by the transistor 202 is increased and the amount of biasing current sunk or absorbed by the RF transistor 204 is decreased.

Similarly, when the voltage at the T1-$I_{sw}$ junction 216 is high, the driver 206 acts to change the voltage at the transistor gate 212, and via the passive transformers 300, to change the voltage at the RF transistor gate 214. Specifically, when the voltage at the T1-$I_{sw}$ junction 216 is high, the passive transformers 300 is such that the primary winding has more turns than the secondary winding, the operational amplifier output an increased control voltage, thereby resulting in an increased voltage output at the RF transistor gate 214. Accordingly, the current provided by the transistor 202 is decreased and the amount of biasing current sunk or absorbed by the RF transistor 204 is increased.

Referring still to FIG. 3 and as briefly mentioned above, in the apparatus 200 and system of FIG. 2, the subtracting network can be a pair of transformers serving as a coupler to scale down the voltage sensed, and an active operational amplifier 400. As known in the art, in an operational amplifier, the voltage entering into the amplifier positive input port subtracts the voltage entering into the negative input port. The difference or error voltage between input ports is amplified and output by the amplifier, and vice versa. As seen in FIG. 3, when the voltage at the $T1$-$I_{sw}$ junction 216 is low, the driver 206 acts to change the voltage at the transistor gate 212, and via the operational amplifier 400, to change the voltage at the RF transistor gate 214. Specifically, when the voltage at the $T1$-$I_{sw}$ junction 216 is low, the operational amplifier 400 acts such that the transistor gate 212 voltage scaled down and the transistor 202 output voltage scaled down are the inputs in the operational amplifier, resulting in a subtracted difference or error voltage output, thereby leading to a decreased voltage output at the RF transistor gate 214. Accordingly, the current provided by the transistor 202 is increased and the amount of biasing current sunk or absorbed by the RF transistor 204 is decreased.

Similarly, when the voltage at the $T1$-$I_{sw}$ junction 216 is high, the driver 206 acts to change the voltage at the transistor gate 212, and via the inverter amplifier 400, to change the voltage at the RF transistor gate 214. Specifically, when the voltage at the $T1$-$I_{sw}$ junction 216 is high, the operational amplifier 400 acts such that the transistor gate 212 voltage scaled down and the transistor 202 output voltage scaled down are the inputs in the operational amplifier, resulting in a subtracted difference or error voltage output, thereby leading to an increased voltage output at the RF transistor gate 214. Accordingly, the current provided by the transistor 202 is decreased and the amount of biasing current sunk or absorbed by the RF transistor 204 is increased, resulting in an overall decreased current through the RF transistor 204.

Figure 4:
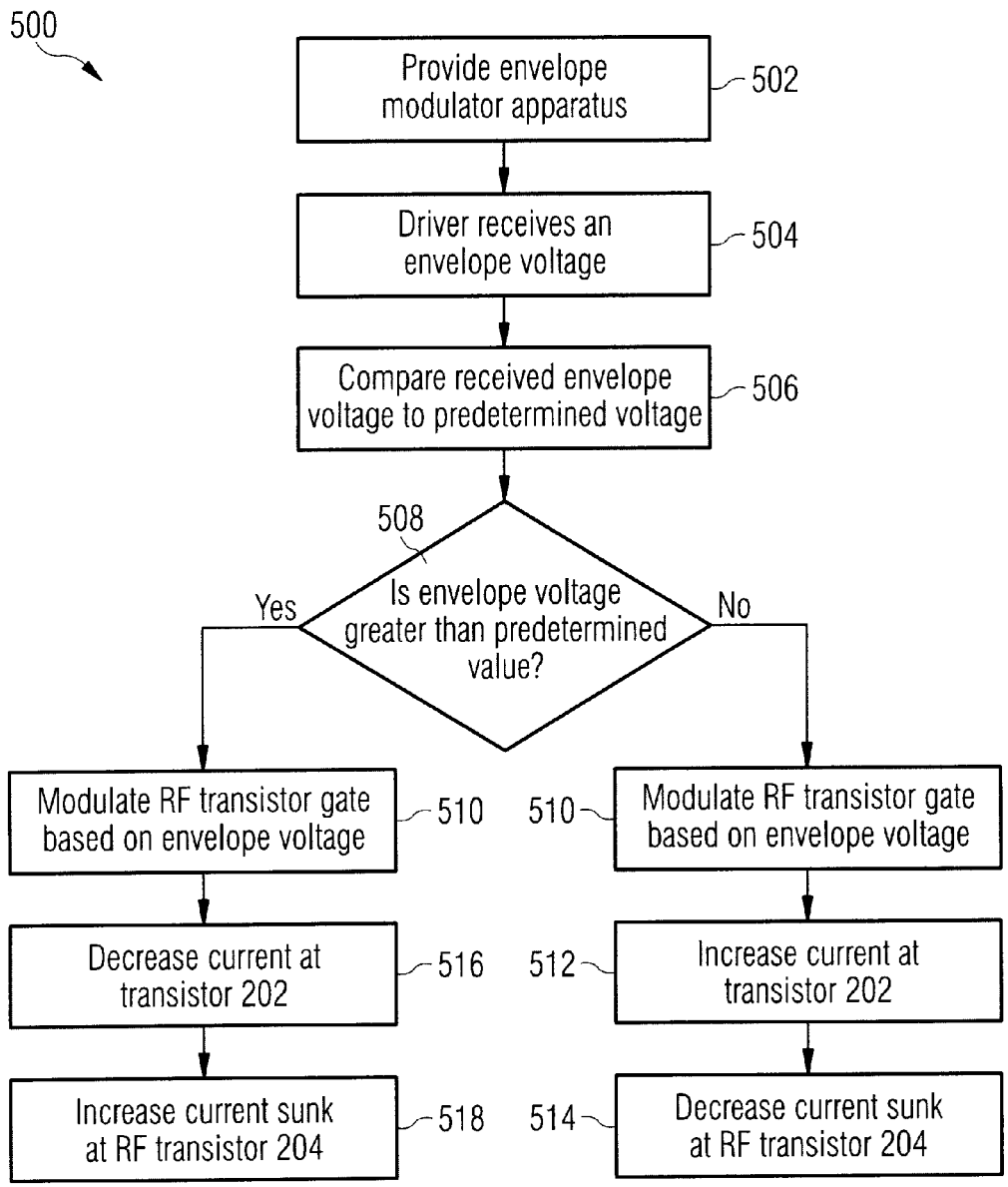
FIG. 4 is a flow chart showing a method for envelope tracking in accordance with an embodiment of the present disclosure.

Referring next to FIG. 4, an envelope tracking method 500 is provided. Specifically, the method 500 includes providing an envelope modulator apparatus, the apparatus including a power transistor, an RF transistor, a driver, a switcher current source and a subtracting network (block 502). Next, the driver receives an envelope voltage (block 504). Once the envelope voltage is received, the driver compares the received envelope voltage to a predetermined voltage (block 506), and determines whether the received voltage is greater than or less than the predetermined voltage (block 508).

Based on this determination, the subtracting network modulates a gate of the RF transistor based on an envelope voltage (block 510). Similar to the apparatus 200 and the system described above, the modulation at the subtracting network can occur at the passive transformers 300 and the active operational amplifier 400 combination.

Next, redundant biasing current is sunk at the RF transistor. More specifically, if the envelope voltage is less than the predetermined value, the method includes the steps of increasing a current at the transistor 202 (block 512) and decreasing the amount of biasing current absorbed at the RF transistor 204 (block 514). In contrast, if the envelope voltage is more than the predetermined value, the method includes the steps of decreasing the current at the transistor 202 (block 516) and increasing the amount of biasing current absorbed at the RF transistor (block 518).

As described above, the present disclosure provides an apparatus, system and method for envelope tracking. The present apparatus 200 provides a transistor 202 and an RF transistor 204, which is in contrast to conventional envelope tracking apparatus that generally have a first transistor, a second transistor and an RF transistor. The present apparatus, therefore, provides an envelope tracking apparatus, system and method with fewer components. In addition, the present disclosure provides improved integration capabilities, as the RF transistor is now part of the envelope tracking modulator apparatus, rather than a separate component. Further, the present disclosure provides the potential for a wider bandwidth performance because there is no longer a T2 or second transistor, as generally found in the prior art. With the removal of T2, the total parasitic capacitance will decrease, which can lead to a wider bandwidth performance. The present disclosure also provides a reduced cost system compared to conventional envelope tracking systems, because the high cost component T2 has been replaced with lower cost subtracting networks. Also, the present disclosure provides for a more efficient envelope tracking apparatus/system/method when compared with conventional systems.

Figure 5:
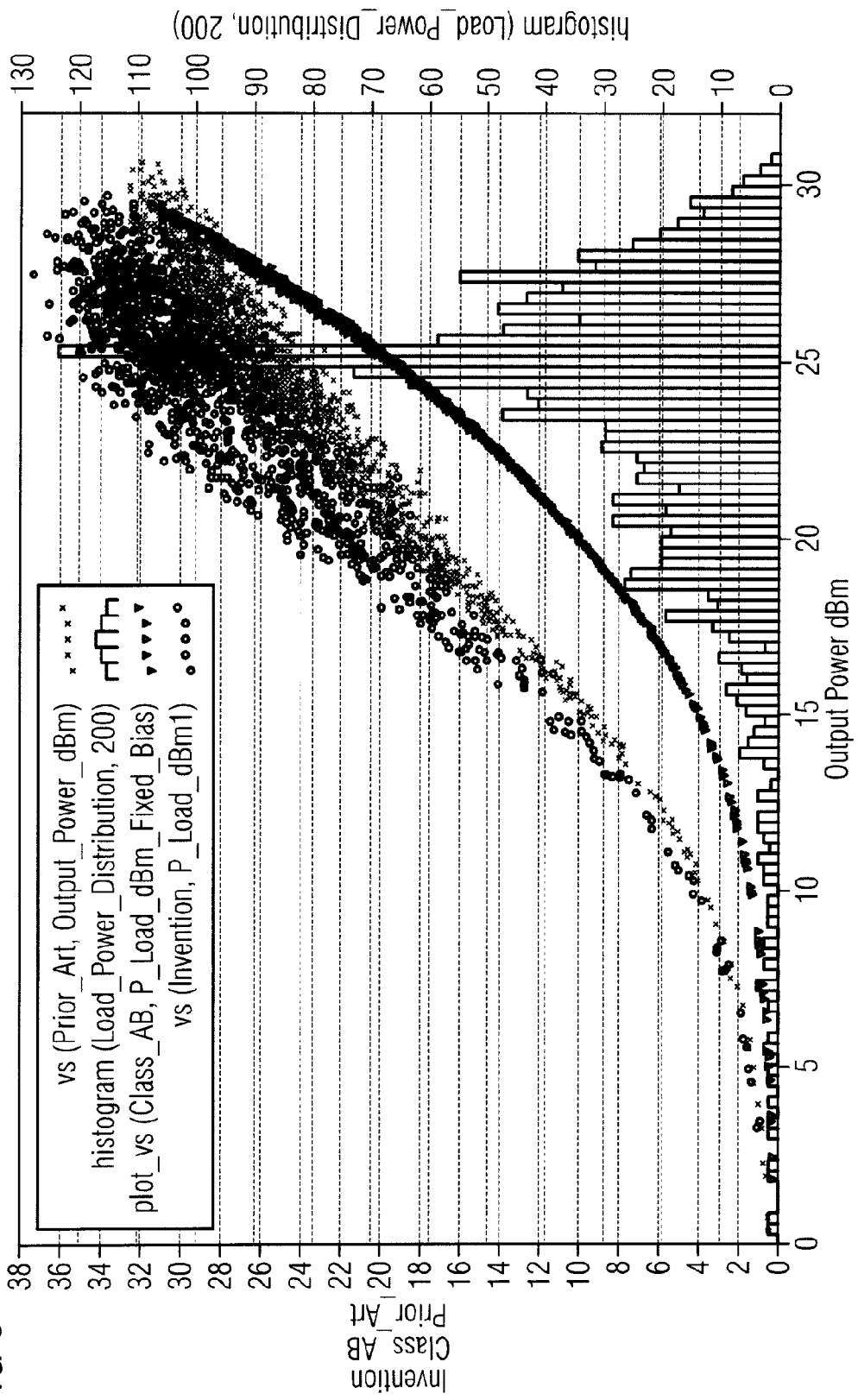
FIG. 5 is a graphical representation of an envelope tracking system utilizing the present disclosure.

Referring now to FIG. 5, a simulation bench is performed on an RF power transistor, matched to 850 MHz, with stimulus as 4G LTE 16QAM FDD up link SC-FDMA signal with 5 MHz bandwidth, peak to average power ratio (PAPR) is −7 dB. The instantaneous power-added efficiency (PAE) and distribution of load signal power histogram is shown together for comparison. As seen in the FIG. 5, the blue invention instantaneous efficiency (utilizing the present disclosure) is higher than the prior art envelope tracking solution (shown in red). Key performance metric comparison summary is shown as below table.

|  | Output Power (dBm) | Average PAE (%) | EVM RMS (%) |
| --- | --- | --- | --- |
| Invention | 24.98 | 29.57 | 5.87 |
| Prior Art | 24.95 | 25.95 | 2.85 |
| Class-AB | 24.97 | 19.88 | 3.73 |

Embodiments of the present disclosure may be implemented in software (executed by one or more processors), hardware (e.g., an application specific integrated circuit), or a combination of software and hardware. In an example embodiment, the software (e.g., application logic, an instruction set) is maintained on any one of various conventional non-transitory computer-readable media. In the context of this document, a "non-transitory computer-readable medium" may be any media or means that can contain, store, communicate, propagate or transport the instructions for use by or in connection with an instruction execution system, apparatus, or device, such as a computer. A non-transitory computer-readable medium may comprise a computer-readable storage medium (e.g., memory or other device) that may be any media or means that can contain or store the instructions for use by or in connection with an instruction execution system, apparatus, or device, such as a computer.

If desired, the different functions discussed herein may be performed in a different order and/or concurrently with each other. Furthermore, if desired, one or more of the above-described functions may be optional or may be combined.

Although various aspects of the disclosure are set out in the independent claims, other aspects of the disclosure comprise other combinations of features from the described embodiments and/or the dependent claims with the features of the independent claims, and not solely the combinations explicitly set out in the claims.

It is also noted herein that while the above describes example embodiments of the disclosure, these descriptions should not be viewed in a limiting sense. Rather, there are several variations and modifications which may be made without departing from the scope of the present disclosure as defined in the appended claims.

One having ordinary skill in the art will readily understand that the disclosure as discussed above may be practiced with steps in a different order, and/or with hardware elements in configurations which are different than those which are disclosed. Therefore, although the disclosure has been described based upon these preferred embodiments, it would be apparent to those of skill in the art that certain modifications, variations, and alternative constructions would be apparent, while remaining within the spirit and scope of the disclosure. In order to determine the metes and bounds of the disclosure, therefore, reference should be made to the appended claims.

The following abbreviations that may be found in the specification and/or the drawing figures are defined as follows:
AC=Alternating Current
BTS=Base Transceiver Station
ET=Envelope Tracking
EVM=Error Vector Magnitude
FDD=Frequency Division Dual
LTE=Long Term Evolution
PA=Power Amplifier
PAE=Power Added Efficiency
PAPR=Peak to Average Power Ratio
RF=Radio Frequency
RMS=Root Mean Squared
SC-FDMA=Single-carrier Frequency-Division Multiple Access
4G=Fourth Generation Wireless Communication

What is claimed is:

1. An apparatus comprising:
a power transistor;
a radio frequency (RF) transistor;
a driver;
a switcher current source; and
a subtracting network, wherein the subtracting network includes an active operational amplifier to generate and amplify an error signal.

2. The apparatus of claim 1, wherein the apparatus is an envelope modulator.

3. The apparatus of claim 1, wherein the RF transistor is in communication with the subtracting network and is configured for absorbing biasing current in the apparatus.

4. The apparatus of claim 1, wherein the driver is configured for receiving an envelope voltage and comparing the envelope voltage to a predetermined voltage value.

5. The apparatus of claim 4, further comprising:
a transistor gate; and
an RF transistor gate
wherein when the envelope voltage is above the predetermined value, the driver is configured to decrease the current through the transistor by acting on the transistor gate by decreasing bias and by acting on the RF transistor gate by increasing bias.

6. The apparatus of claim 4, further comprising:
a transistor gate; and
an RF transistor gate,
wherein when the envelope voltage is below the predetermined value, the driver is configured to increase the current through the transistor by acting on the transistor gate by increasing bias and by acting on the RF transistor gate by decreasing bias.

7. The apparatus of claim 4, wherein when the envelope voltage exceeds the predetermined voltage value, the RF transistor is configured for increasing an amount of absorbed biasing current.

8. The apparatus of claim 4, wherein when the envelope voltage is less than the predetermined voltage value, the RF transistor is configured for decreasing an amount of absorbed biasing current.

9. The apparatus of claim 1, wherein the switcher current source is a BUCK DC-DC converter configured for providing current to the transistor and the RF transistor.

10. The apparatus of claim 1, wherein the subtracting network includes two passive transformers for signal coupling and scaling down.

11. A system for envelope tracking comprising:
a transistor;
a radio frequency (RF) transistor;
a driver;
a switcher current source; and
a subtracting network;
wherein the system is configured such that when an envelope voltage is less than a predetermined voltage value, the RF transistor is configured for decreasing an amount of absorbed biasing current, and when the envelope voltage is greater than a predetermined voltage value, the RF transistor is configured for increasing an amount of absorbed biasing current.

12. The system of claim 11, wherein the subtracting network includes two passive transformers for signal coupling and scaling down.

13. The system of claim 11, wherein the subtracting network includes an active operational amplifier to generate and amplify an error signal.

14. A method comprising:
providing an envelope modulator apparatus, the apparatus including a transistor, radio frequency (RF) transistor, a driver, a switcher current source, and a subtracting network;
modulating, at the subtracting network, a gate of the RF transistor based on an envelope error voltage; and
sinking, at the RF transistor, redundant biasing current generated by the RF transistor.

15. The method of claim 14 further including the steps of, prior to the modulating:
receiving, at the driver, the envelope voltage;
comparing, at the driver, the received envelope voltage to a predetermined voltage; and
determining, based on the predetermined voltage, whether the received envelope voltage is greater than or is less than the predetermined voltage.

16. The method of claim 15 further including the steps of, in response to the determining:
increasing a current at the transistor if the envelope voltage is less than the predetermined value; and
decreasing the sunk biasing current at the RF transistor if the envelope voltage is less than the predetermined value.

17. The method of claim 15 further including the steps of, in response to the determining:
decreasing the current at the transistor if the envelope voltage is greater than a predetermined value; and
increasing the sunk biasing current at the RF transistor if the envelope voltage is greater than the predetermined value.

18. The method of claim 14, wherein the modulating occurs at two passive transformers for signal coupling and scaling down.

19. The method of claim 14, wherein the modulating occurs at an active operational amplifier to generate and amplify the error signal.

\* \* \* \* \*